United States Patent [19]
Boerstler et al.

[11] Patent Number: 5,389,832
[45] Date of Patent: Feb. 14, 1995

[54] CAPACITIVELY CROSS-COUPLED DCS EMITTER-FOLLOWER OUTPUT STAGE

[75] Inventors: David W. Boerstler, Millbrook; Edward B. Eichelberger, Hyde Park; Gary T. Hendrickson, Kingston; Charles B. Winn, Hyde Park, all of N.Y.

[73] Assignee: International Business Machines Corporation, Armonk, N.Y.

[21] Appl. No.: 217,139

[22] Filed: Mar. 3, 1994

Related U.S. Application Data

[63] Continuation of Ser. No. 101,679, Aug. 4, 1993, abandoned, which is a continuation of Ser. No. 956,922, Oct. 2, 1992, abandoned.

[51] Int. Cl.[6] .................................... H03K 3/29
[52] U.S. Cl. .................................... 327/223; 327/199; 327/586; 326/126
[58] Field of Search .................. 307/355, 455, 246, 289, 307/482, 320

[56] References Cited

U.S. PATENT DOCUMENTS

| | | | |
|---|---|---|---|
| 2,831,987 | 4/1958 | Jones | 307/88.5 |
| 3,463,939 | 8/1969 | Sturman | 307/355 |
| 3,909,637 | 9/1975 | Dorler | 307/320 |
| 4,754,171 | 6/1988 | Dasai et al. | 307/455 |
| 4,760,289 | 7/1988 | Eichelberger et al. | 307/455 |

FOREIGN PATENT DOCUMENTS 0255589 2/1988 European Pat. Off. .

OTHER PUBLICATIONS

E. B. Eichelberger et al., "Differential Current Switch-High Performance at Low Power", IBM Journal of Research and Development, vol. 35, No. 3, pp. 313-320, May 1991.

H. J. Greub et al., "High-Performance Standard Cell Library and Modeling Technique for Differential Advanced Bipolar Current Tree Logic", IEEE Journal of Solid-State Circuits, vol. 26, No. 5, pp. 749-762, May 1991.

*Primary Examiner*—Margaret R. Wambach
*Attorney, Agent, or Firm*—Lawrence D. Cutter

[57] ABSTRACT

An output stage device for an enhanced differential current switch. The output stage receives a differential signal pair from a prior logic stage and must shift the output signals to the levels necessary for the next stage. The output stage has a differential pair of emitter followers that are capacitively cross coupled. Capacitors couple the collector of a first transistor to the emitter of the second. The capacitors can be formed from forward biased diodes or transistors. The result is a more rapid falling output transition while reducing power requirements.

5 Claims, 2 Drawing Sheets

CAPACITIVELY CROSS-COUPLED DCS EMITTER-FOLLOWER OUTPUT STAGE

This is a continuation of application(s) Ser. No. 08/101,679, filed on Aug. 4, 1993, now abandoned, which is a continuation of Ser. No. 07/956,922, filed on Oct. 2, 1992, now abandoned.

BACKGROUND OF THE INVENTION

1. Field of the Invention

The present invention relates generally to solid state digital logic circuits and particularly to bipolar, emitter coupled logic (ECL) circuits. More particularly, the invention relates to improvements to differential current switch (DCS) logic circuits.

2. Background and Related Art

Digital logic circuits in current generation computers are frequently implemented as VLSI circuits. Bipolar emitter coupled logic (ECL) circuits predominate and are found in, for example, the IBM ES/9000 series of large computers.

Circuit designers are continually seeking to increase the speed of the logic circuits and to reduce the power consumed by such circuits. Power consumption is particularly critical in circuits having high logic density due to the resulting heat dissipation that must be removed by cooling apparatus.

Differential current switch logic (DCS) circuits have been proposed to increase circuit speed without an accompanying increase in power. U.S. Pat. No. 4,760,289, to Eichelberger et al. (commonly assigned) for a "Two Level Differential Cascode Current Switch Masterslice" is an example of such a circuit and is a "Two Level Differential Cascode Current Switch Masterslice" is an example of such a circuit and is incorporated by reference. The DCS circuit described in Eichelberger et al. improves switching speed by up to twenty percent without an increase in power.

DCS devices have been enhanced over the '289 design by incorporating a third cascode level and the circuitry necessary to provide input and output signals to each circuit level. The structure of an enhanced DCS (EDCS) circuit is shown in FIG. 1. The output performance of most VLSI circuit technologies like EDCS is a strong function of the capacitive load or fanout of the output. The output stage 16 provides the circuitry to meet output load requirements.

SUMMARY OF THE INVENTION

The present invention is directed to providing an improved output stage for an enhanced differential current switch (EDCS) logic circuit. The output stage of the present invention has a pair of differential emitter follower circuits. The base of the transistor in each emitter follower circuit receives as input one of the differential signals of the EDCS logic. The collector of each transistor is capacitively cross coupled to the emitter of the other transistor. Capacitance can be discrete capacitors or junction diodes or the collector base junction of transistors. The output signals are generated at the emitter of each transistor.

It is an object of the present invention to provide an output stage with rapid transitions between output states.

It is a further object of the invention to provide improved performance without increasing output stage power requirements.

The foregoing and other objects, features and advantages of the invention will be apparent from the following more particular description of a preferred embodiment of the invention, as illustrated in the accompanying drawing wherein like reference numbers represent like parts of the invention.

DETAILED DESCRIPTION

The enhanced differential current switch logic family provides the basis for computer logic designs for computers such as the IBM ES/9000 series. This logic family is implemented using VLSI technology to provide a set of logic building blocks. The basic VLSI design approach is based on a number of cells that can be "wired" in different ways to provide a set of "books" of basic logic function Logic functions can be 'AND', 'OR' and so forth (see Eichelberger et al. above.)

Figure 1:
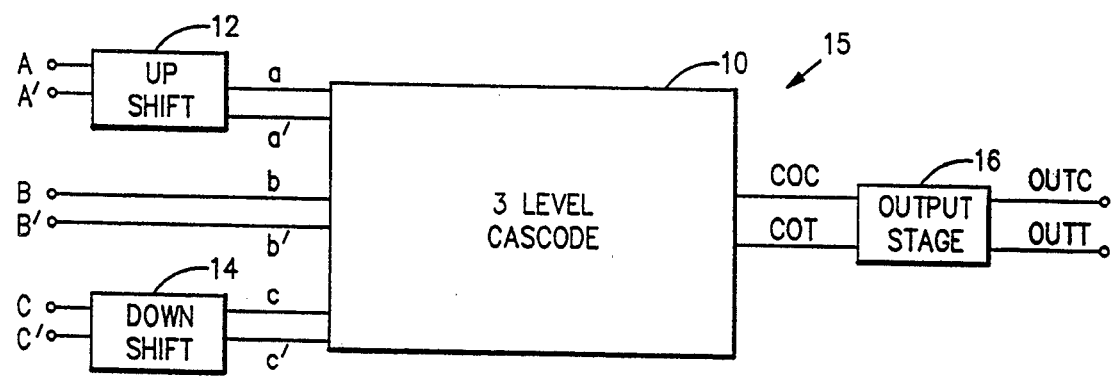
FIG 1 is a block diagram of an enhanced differential current switch logic circuit according to the present invention.

The enhanced differential current switch shown in FIG. 1 has the advantage of having a third input level increasing the logic fan-in and function producible with that circuit.

EDCS is designed to work with existing emitter coupled logic (ECL) components. As such, it must provide appropriately loaded output signals and be able to accept inputs from ECL components. This is accomplished by maintaining input and output levels compatible with ECL current switch emitter follower (CSEF) levels. All signals are provided at the middle cascode level and must be up-shifted or down-shifted for the upper or lower cascode levels.

The basic structure of an EDCS circuit 15 employing the present invention is shown in FIG. 1. Three level cascode logic 10 provides the basic logic of the device. Logic 10 can implement an OR, XOR, AND or similar logic function The inputs to the EDCS circuit 15 are A, A'. B, B', C, C' (where A and A' is a differential pair and A' is the complement of A). Inputs A,A' are up-shifted by up-shift circuit 12 and inputs C, C' are down-shifted by down-shift circuit 14 to provide the necessary voltage to the cascode logic 10. Outputs COC and COT flow through output stage 16 to provide the outputs OUTC and OUTT with the current necessary to drive the capacitive load of the following logic circuit.

Figure 2:
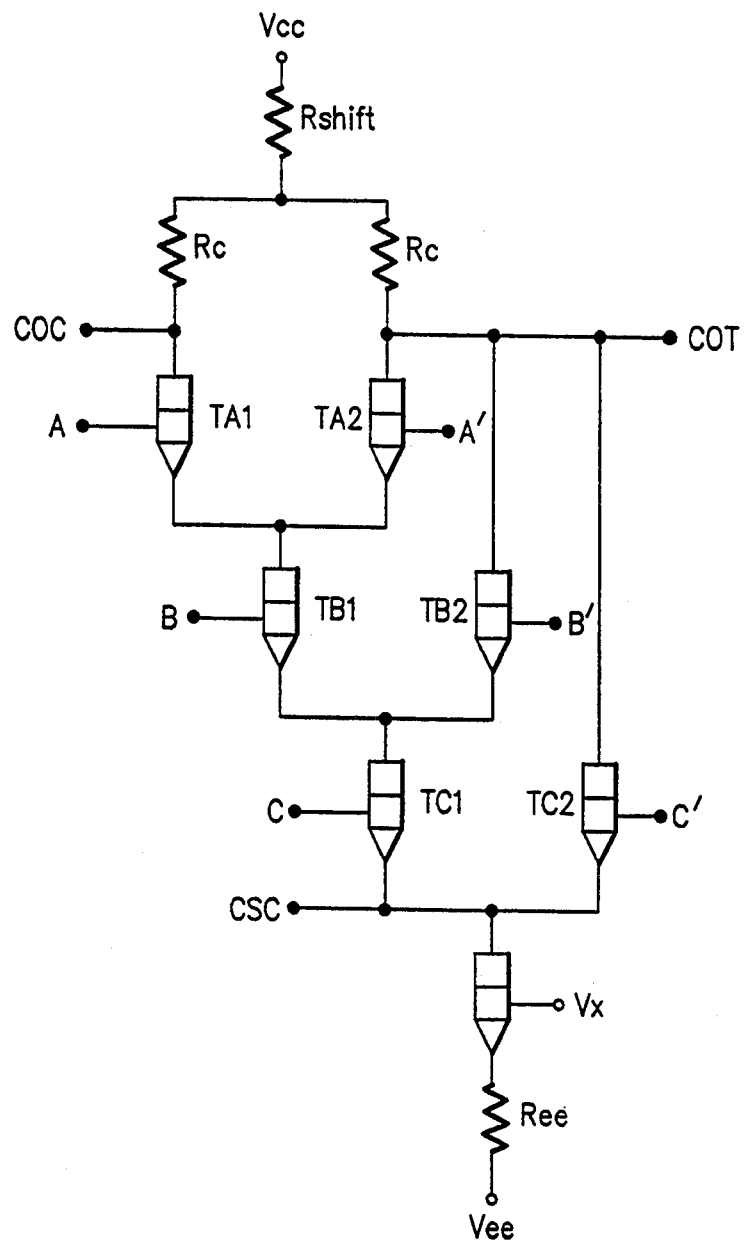
FIG. 2 is a circuit diagram illustrating an 'AND' circuit implemented using three level cascode EDCS logic.

FIG. 2 is an example of three level cascode logic that can be used with the present invention. FIG. 2 represents an 'AND' logic circuit, although EDCS can be used to provide any logic function of 3 variables.

In the preferred embodiment as illustrated by FIG. 2, the differential inputs are at the following levels: a/a' 1.0/0.9 V; b/b' 0.3/0.1 V; and c/c' $-0.5/-0.7$ V. The supply voltage, $V_{cc}$, is 1.4 V, $V_{ee}$ is $-2.2$ V, and $V_x$ is $-0.8$ V. The outputs COT/COC are 1.1/0.9 V and are connected to the output stage 16 which will be described in greater detail below. Output stage 16 drops the output level of OUTT/OUTC to 0.3/0.1 V, the level compatible with the middle stage of the next circuit. $R_{shift}$ provides a constant 300 mV drop down from $V_{cc}$. The operation of the logic circuit will not be further described as it does not form part of the present invention. This AND circuit provides the logic function OUTT=A AND B AND C.

Figure 3:
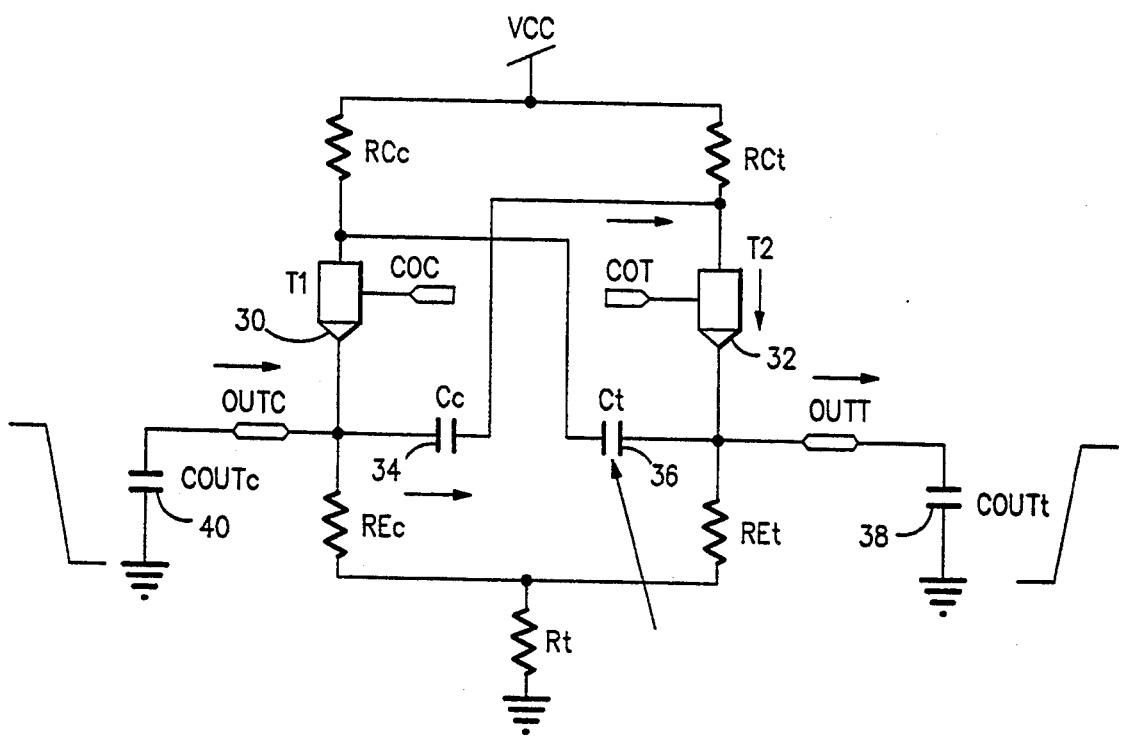
FIG. 3 is a circuit diagram depicting the EDCS output stage according to the present invention.

Output stage 16 is shown in greater detail in FIG. 3. The improved output stage of the present invention is designed to speed the signal transition times. The use of a differential pair of simple emitter follower circuits speeds the transition over standard ECL systems because one of the outputs is always making the faster (rising) transition. The receiving circuit responds to the difference between the outputs and always sees a fast transition. The delay can be further improved, however, by speeding the falling signal.

An improved output stage according to the present invention is shown in FIG. 3. Inputs COC and COT come from the collector resistors of the previous stage (see FIG. 2.) Two transistors, T1 30, and T2 32, are connected in an emitter follower configuration except that the collectors are connected to supply voltage $V_{cc}$ through collector resistors $R_{Cc}$ and $R_{Ct}$, respectively. The collector of T1 30 (T2 32) develops a signal opposite in phase to the signal at the emitter output signal OUTC (OUTT), but which is in phase with the other emitter output signal OUTT(OUTC). The collector of T1 30 (T2 32) is capacitively cross coupled to OUTT-(OUTC) through capcitor $C_t$ 36 ($C_c$ 34).

The output OUTT (or OUTC) rises quickly due to the low impedance emitter follower drive. The current to charge the output capacitance $COUT_t$ 38 ($COUT_c$ 40) comes partly from the $V_{cc}$ supply through collector resistor $R_{Ct}$($R_{Cc}$), but primarily from the opposite phase output capacitance $COUT_c$ ($COUT_t$) through the cross coupling capacitor $C_c$ 34 ($C_t$ 36). This current effectively discharges the output phase capacitance $COUT_c$ 40 ($COUT_t$ 38) forcing the output OUTC (OUTT) to fall quickly.

The switching current flows from the negative going output load capacitor, e.g. $COUT_c$ 40, through the cross coupling capacitance, $C_c$ 34, through the rising output emitter follower transistor, T2 32, to charge the rising output load capacitance, $COUT_t$ 38. Since this current does not flow through any power supply the circuit delta I noise is virtually eliminated. This is particularly useful when the circuit is used as a differential off-chip driver where delta I currents can dominate chip noise.

The falling transition of the output is faster than it would be with just the emitter follower pull down resistor. The output section delay is not a strong function of DC power and redirection of the emitter follower power to the current switch stage can improve the total circuit speed power product.

Prior art emitter follower output stages attempt to make the emitter resistor look like a current source by returning to a low value of $V_T$. This is done to prevent the current in the transistor from changing, minimizing the swing loss from base to emitter. The circuit of the present invention requires the emitter current to change to develop a signal at the collector. In this circuit, if $V_T$ is too low the emitter resistors can be returned to a common resistor $R_t$ to force the emitter signal to develop a current change. The values of collector resistors $R_{Ct}$ and $R_{Cc}$ should be approximately equal to the values of the emitter resistors, $R_{Et}$ and $R_{Ec}$ so that the collector signal swings about the same amount as the output signal. This collector signal is then AC coupled to the other output giving the proper negative going swing. Resistor values depend upon the power/delay performance needed and the technology used in the circuit. In the preferred embodiment $R_c=R_e=600$ Ohms and $R_t=400$ Ohms. Lower power designs would use significantly larger resistor values.

Cross coupling capacitors $C_t$ 36 and $C_c$ 34 must be large compared to the output load $COUT_t$ and $COUT_c$ so the voltage across them does not change by capacitance division. The cross coupling capacitance must be in the range of four to five times the load capacitance. The large capacitance can be achieved with a forward biased junction diode or transistor structure. The circuit can be DC biased to provide a $V_{be}$ across each of the cross coupled diodes with a small DC bias current. The diffusion capacitance can support large AC currents to switch the negative transition output load capacitance. Since the emitter and collector swings are the same (as described above) the DC biasing of the diode/transistor coupling elements is maintained.

Figure 4A:
FIG. 4(a)–4(c) are example configurations providing capacitance required by the present invention.
Figure 4B:
Figure 4C:
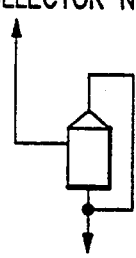

Alternate embodiments of the cross coupling elements are shown in FIG. 4. The cross coupling element can be a forward biased diode, 4(a), a transistor with the emitter and base shorted, 4(b), or a transistor with the emitter and collector shorted, 4(c). The transistor structures biased in this way make use of the forward biased base-collector junction which is typically larger than the base-emitter junction and develops more capacitance for a given current.

The cross coupled diodes can be biased with output up/down levels of 0.3 V and 0.1 V respectively when $V_{cc}$ is 1.4 V and $V_T$ is $-0.7$ V. This can be accomplished by dropping 300 mV on a shift resistor to $V_{cc}$ in the current switch stage 10.

It will be understood from the foregoing description that various modifications and changes may be made in the preferred embodiment of the present invention without departing from its true spirit. It is intended that this description is for purposes of illustration only and should not be construed in a limiting sense. The scope of this invention should be limited only by the language of the following claims.

We claim:

1. A differential output circuit for connecting a differential current switch circuit to a load, said circuit comprising:

a pair of differential emitter follower circuits said pair having a first and a second transistor each having a base, a collector and an emitter, the collectors of said first and second transistors each connected through a resistor to a positive potential source;

first capacitance means coupled between the collector of said first transistor and the emitter of said second transistor;

second capacitance means coupled between the collector of said second transistor and the emitter of said first transistor; and input means for receiving a differential input from said differential current switch circuit, said input means connected to the base of said first and second transistors.

2. The circuit of claim 1 wherein said first and second capacitance means are transistors having a base, a collector and an emitter, wherein the base and emitter are shorted.

3. The circuit of claim 1 wherein said first and second capacitance means are transistors having a base, a collector and an emitter, wherein the emitter and collector are shorted.

4. The circuit of claim 1 wherein said first and second capacitance means are forward biased diodes.

5. The circuit of claim 1 further comprising:

a first and second emitter resistor respectively connected to the emitters of said first and second transistors; and a common resistor connected in electrical series to each of said emitter resistors and to a low reference potential.

* * * * *